United States Patent
Bogaerts et al.

(10) Patent No.: US 8,334,491 B2
(45) Date of Patent: Dec. 18, 2012

(54) PIXEL ARRAY WITH SHARED READOUT CIRCUITRY

(75) Inventors: Jan Bogaerts, Sint Katelijine Waver (BE); Guy Meynants, Retie (BE)

(73) Assignee: CMosis NV, Antwerp (BE)

( * ) Notice: Subject to any disclaimer, the term of this patent is extended or adjusted under 35 U.S.C. 154(b) by 587 days.

(21) Appl. No.: 12/544,755

(22) Filed: Aug. 20, 2009

(65) Prior Publication Data

US 2010/0148037 A1    Jun. 17, 2010

(30) Foreign Application Priority Data

Dec. 12, 2008 (GB) .................................. 0822680.5

(51) Int. Cl.
*H01L 27/146* (2006.01)
*H04N 3/14* (2006.01)
(52) U.S. Cl. ...................... 250/208.1; 257/292; 348/280; 348/281; 348/308
(58) Field of Classification Search ............... 250/208.1; 257/291, 292; 348/294, 300, 301, 302, 308, 348/246, 272, 273, 277, 280, 281
See application file for complete search history.

(56) References Cited

U.S. PATENT DOCUMENTS

| | | | | |
|---|---|---|---|---|
| 4,477,835 A * | 10/1984 | Berger et al. | ................. | 348/324 |
| 5,793,071 A * | 8/1998 | Sekine | .......................... | 257/240 |
| 6,043,478 A | 3/2000 | Wang | | |
| 6,107,655 A | 8/2000 | Guidash | | |
| 6,133,954 A * | 10/2000 | Jie et al. | ........................ | 348/308 |
| 6,352,869 B1 | 3/2002 | Guidash | | |
| 6,977,684 B1 * | 12/2005 | Hashimoto et al. | ........... | 348/294 |
| 7,057,150 B2 | 6/2006 | Zarnowski et al. | | |
| 7,244,920 B2 * | 7/2007 | Kim et al. | .................. | 250/208.1 |
| 7,361,881 B2 * | 4/2008 | Spartiotis | .................. | 250/214 L |
| 7,659,932 B2 * | 2/2010 | Kobayashi | .................... | 348/311 |
| 7,714,917 B2 * | 5/2010 | McKee | ......................... | 348/294 |
| 7,812,878 B2 * | 10/2010 | Kudoh | .......................... | 348/308 |
| 7,830,437 B2 * | 11/2010 | McKee et al. | ................. | 348/302 |

(Continued)

FOREIGN PATENT DOCUMENTS

KR      10-0858033        9/2008

(Continued)

OTHER PUBLICATIONS

Search Report of UK Intellectual Property Office regarding British Patent Application No. GB 0822680.5, Mar. 25, 2009.

(Continued)

*Primary Examiner* — John Lee
(74) *Attorney, Agent, or Firm* — Bacon & Thomas, PLLC

(57) ABSTRACT

A pixel array comprises a plurality of photo-sensitive elements arranged in rows and columns and readout circuitry for reading a value of a photo-sensitive element. Shared readout circuitry is provided for a pair of adjacent photo-sensitive elements. Adjacent instances of the shared readout circuitry are staggered with respect to one another. For a layout having shared readout circuitry for a pair of photo-sensitive elements, adjacent instances of the shared readout circuitry are offset by a horizontal distance of one column and a vertical distance of one row of the array. The shared readout circuitry can serve a pair of adjacent photo-sensitive elements in a row or column of the array, or a pair of photo-sensitive elements which are diagonally adjacent in the array. An improved yield and symmetry results from staggering instances of the shared readout circuitry.

19 Claims, 20 Drawing Sheets

U.S. PATENT DOCUMENTS

| | | | |
|---|---|---|---|
| 7,915,702 B2* | 3/2011 | Parks | 257/462 |
| 7,916,195 B2* | 3/2011 | Kudoh | 348/294 |
| 7,924,333 B2* | 4/2011 | Yin et al. | 348/308 |
| 7,989,749 B2* | 8/2011 | Yin et al. | 250/208.1 |
| 8,031,249 B2* | 10/2011 | McKee | 348/308 |
| 2002/0158977 A1* | 10/2002 | Hamilton, Jr. | 348/246 |
| 2004/0025140 A1* | 2/2004 | Singh et al. | 716/21 |
| 2004/0252212 A1* | 12/2004 | Ohkawa | 348/308 |
| 2005/0030403 A1* | 2/2005 | Yaung et al. | 348/308 |
| 2005/0042817 A1* | 2/2005 | Kawamura | 438/232 |
| 2005/0280729 A1* | 12/2005 | Sekine | 348/308 |
| 2006/0119715 A1* | 6/2006 | Nam | 348/272 |
| 2006/0208163 A1 | 9/2006 | Manabe et al. | |
| 2006/0238629 A1* | 10/2006 | Sato et al. | 348/241 |
| 2006/0256221 A1 | 11/2006 | McKee et al. | |
| 2007/0158713 A1* | 7/2007 | Ohkawa | 257/292 |
| 2007/0216786 A1* | 9/2007 | Hung et al. | 348/246 |
| 2008/0062290 A1* | 3/2008 | Lahav et al. | 348/280 |
| 2008/0088724 A1 | 4/2008 | Kudoh | |
| 2009/0090845 A1* | 4/2009 | Yin et al. | 250/208.1 |
| 2010/0148037 A1* | 6/2010 | Bogaerts et al. | 250/214 A |
| 2010/0182463 A1* | 7/2010 | Hung et al. | 348/246 |

FOREIGN PATENT DOCUMENTS

| | | |
|---|---|---|
| WO | 2007/105905 A1 | 9/2007 |
| WO | 2008/133146 A1 | 6/2008 |

OTHER PUBLICATIONS

GB Office communication for related application GB0822680.5 of Aug. 23, 2012.

\* cited by examiner

■ defect pixel

▥ non-defect pixel used to correct defect pixel single bad row  single bad column  single bad column/row 2 adjacent bad rows  2 adjacent bad columns single bad tx line single bad column single bad column/bad tx line single bad reset/select line single bad column/bad reset /select line 2 adjacent bad tx lines 2 adjacent bad reset/ select lines
N.B. lines are 2xpitch apart 2 adjacent bad columns single bad tx line single bad column single bad column/bad tx line single bad reset/select line single bad column/bad reset/select line single bad column/bad reset/select line 2 adjacent bad tx lines 2 adjacent bad reset/select lines 2 adjacent bad columns

| G | B | R | G |
|---|---|---|---|
| R | G | G | B |

Fig. 20

| G | B | R | G | G | B | R | G | G | B | R | G | G | B | R | G |
|---|---|---|---|---|---|---|---|---|---|---|---|---|---|---|---|
| R | G | G | B | R | G | G | B | R | G | G | B | R | G | G | B |
| G | B | R | G | G | B | R | G | G | B | R | G | G | B | R | G |
| R | G | G | B | R | G | G | B | R | G | G | B | R | G | G | B |

Fig. 21

| Cy | | Ye | | Cy | | Ye | | Cy | | Ye | | Cy | | Ye |
|---|---|---|---|---|---|---|---|---|---|---|---|---|---|---|
| | 2G | | Mg | | 2G | | Mg | | 2G | | Mg | | 2G | |
| Cy | | Ye | | Cy | | Ye | | Cy | | Ye | | Cy | | Ye |
| | 2G | | Mg | | 2G | | Mg | | 2G | | Mg | | 2G | |

Fig. 22

| G | B | G | R |
|---|---|---|---|
| R | G | G | B |

Fig. 23

| G | B | G | R | G | B | G | R | G | B | G | R | G | B | G | R |
|---|---|---|---|---|---|---|---|---|---|---|---|---|---|---|---|
| R | G | G | B | R | G | G | B | R | G | G | B | R | G | G | B |
| G | B | G | R | G | B | G | R | G | B | G | R | G | B | G | R |
| R | G | G | B | R | G | G | B | R | G | G | B | R | G | G | B |

PIXEL ARRAY WITH SHARED READOUT CIRCUITRY

FIELD OF THE INVENTION

This invention relates to pixel arrays which can be used in applications such as image sensors.

BACKGROUND TO THE INVENTION

FIG. 1 shows a schematic of a typical pinned photodiode four transistor (4T) active pixel, of the type used in image sensors. The active pixel comprises a pinned photodiode PD, a transfer gate TG, a reset transistor M1, a buffer amplifier M2 and a select transistor M3. A pinned photodiode PD is selectively connected to a sense node FD via the transfer gate TG. The transfer gate TG is controlled by a control line Tx. The reset transistor M1 connects between the sense node FD and a supply line VDD. Transistor M1 is controlled by a signal RESET. Transistor M2 is also connected to the sense node FD and is configured as a source-follower amplifier which acts as a buffer amplifier for the signal generated by the photodiode PD. A transistor M3 connects between the output of the buffer amplifier M2 and an output bus and is controlled by a signal provided by control line SELECT. In operation, photocharge is accumulated by the photodiode PD. Before readout of the photocharge, the floating diffusion (FD) is reset through the reset switch M1. The reset level is read out through the source follower M2 and selection transistor M3 to the column bus. Then the charges accumulated in the photodiode PD are transferred through the transfer transistor to the floating diffusion FD. The signal level is again read out through the source follower M2 and selection transistor M3.

FIG. 2 shows a first way of arranging a plurality of the pixels of FIG. 1 to form a pixel array suitable for fabrication in semiconductor material. Each photodiode PD has its own transfer gate, reset transistor, buffer amplifier and read transistor. The reset transistor, buffer amplifier and read transistor will be called readout circuitry. Each pixel is controlled by three horizontal control lines (SELECT, RESET AND TRANSFER (Tx)). Each control line operates all of the pixels in a single row of the pixel array. A pixel building block of the array is shown as item 100, and comprises a photodiode 101, readout circuitry 102 and control lines. The pixel building block 100 is replicated across an area to form the pixel array. Looking at the resulting array, photodiode 111 is served by readout circuitry 112; photodiode 113 is served by readout circuitry 114, and so on. This architecture requires the routing of three horizontal metal lines per pixel pitch. Other types of pixel are known which use more transistors and these may have more, or fewer, control lines and readout lines. For example, an array which is capable of global shutter operation requires more transistors and control lines.

One known way of increasing the density of pixels in an array is to arrange for a number of photodiodes to share the readout circuitry. In this way, each photodiode does not require the readout circuitry shown in FIG. 1. FIG. 3 schematically shows two photodiodes PD1, PD2 which share readout circuitry 20. Reset transistor M1, buffer amplifier M2 and select switch M3 are used, on a time-shared basis, to readout a value representing the amount of charge accumulated by each photodiode. The values are read consecutively through a common column bus. Each photodiode has a dedicated transfer gate TG1, TG2 to transfer accumulated charge to the sense node when that photodiode is read.

A known layout of a two-shared pixel is shown in FIG. 4. A pixel "building block", or unit cell, is shown as item 200. This is the basic element which is repeated multiple times to form the array. The pixel building block 200 has a reset and select line, two transfer lines and a single column bus (not shown). Looking at the resulting array, photodiodes 211 and 212 are served by readout circuitry 213; photodiodes 214 and 215 are served by readout circuitry 216, and so on. The advantage of this sharing architecture is that less readout circuitry 213, 216 is required in the pixel array, which results in more area for the photodiodes. A further advantage is that only two metal lines need to be routed per pixel pitch, compared with three lines for the non-shared architecture. The capacitive load of readout junctions on the column bus is also reduced by a factor of two.

A particular disadvantage of this architecture is that it has an asymmetrical pixel configuration, which means that the photodiodes are optically different (e.g. 211 vs 212, 214 vs 215 and so on). The photoresponse of the photodiodes can typically differ significantly when the chief ray angle is not perpendicular. Impinging photons are reflected/absorbed differently depending on the metal routing (which is different for the different photodiodes) and angle of incidence. Many applications require a symmetrical Modulation Transfer Function (MTF) and similar cross-talk behaviour for all of the pixels, and cannot tolerate asymmetry.

Examples of shared-pixel architectures are described in: U.S. Pat. No. 6,107,655 (2×2 pixel sharing); U.S. Pat. No. 6,352,869 (2×2 pixel sharing); U.S. Pat. No. 7,057,150; US 2006/0256221 A1; U.S. Pat. No. 6,043,478; and US 2006/0208163 A1.

The present invention seeks to provide an alternative way of providing a shared pixel architecture.

SUMMARY OF THE INVENTION

A pixel array comprises a plurality of photo-sensitive elements arranged in rows and columns. Readout circuitry is provided for reading a value of a photo-sensitive element. An instance of the readout circuitry is provided for each pair of adjacent photo-sensitive elements, the instance of the readout circuitry being shared by the pair of photo-sensitive elements. Adjacent instances of the readout circuitry are staggered with respect to one another.

A unit block of a pair of photo-sensitive elements and shared readout circuitry is repeated in a staggered manner to form the array. Advantageously, the photo-sensitive elements are photodiodes, or pinned photodiodes.

Advantageously, each repetition of the unit block/readout circuitry is offset by a horizontal distance of one column and by a vertical distance of one row from the nearest adjacent instance of the unit block. A pixel array with shared readout circuitry has some advantages in terms of speed, power consumption and electro-optical performance compared to an array of non-shared pixels. Sharing readout circuitry between photo-sensitive elements requires less overall readout circuitry, and this in turn lowers the capacitance of the control lines/column bus. This leads to higher speed and/or lower power consumption. Less circuitry in the pixels leaves more area for the photo-sensitive elements, which can increase the full well charge of the pixels. Less control lines improves the fill factor of pixels as there are fewer metal tracks blocking the incident light.

Shared pixel layouts conventionally require approximately one half of the interconnect lines of non-shared pixels, and are therefore expected to have better yields (e.g. in terms of shorts between metal lines since less interconnect lines are vulnerable to defects). However, the traditional sharing approach is susceptible to single defect lines, and a defect line immediately results in a non-correctable defect line of pixels. For example, if a reset line which controls a row of pixels has a defect in the form of a short to ground, all of the pixels in that row cannot be reset. In contrast, the staggered layout has an advantage that a defect in a control line will affect only half of the pixels in a row, as the other pixels in that row will be served by a different control line.

The new sharing approach can be used to achieve symmetric pixel layouts, resulting in a similar MTF for all of the pixels in the array.

The shared readout circuitry comprises at least one component shared by the photo-sensitive elements, such as: a buffer amplifier for buffering a signal from the photo-sensitive element; a reset switch for resetting a sense node to a predetermined voltage; a select switch for selectively reading a buffered signal from the pixel. The term "readout circuitry" does not require that a select switch is always present, as some architectures do not require this. The shared readout circuitry can include some redundancy, such as by comprising two buffer amplifiers arranged in parallel and/or two select switches arranged in series or parallel.

The photo-sensitive elements and shared readout circuitry can be implemented as CMOS active pixel sensors.

The terms "horizontal" and "vertical" are used in this specification to differentiate two orthogonal directions and do not imply any particular orientation of the array.

BRIEF DESCRIPTION OF THE DRAWINGS

Embodiments of the invention will be described, by way of example only, with reference to the accompanying drawings in which:

FIGS. 20 and 21 show a colour filter array pattern which can be applied to a pixel array;

FIG. 22 shows a result of horizontally binning outputs of pairs of photo-sensitive elements in the pixel array;

FIGS. 23 and 24 show another colour filter array pattern which can be applied to a pixel array.

DESCRIPTION OF PREFERRED EMBODIMENTS

Figure 1:
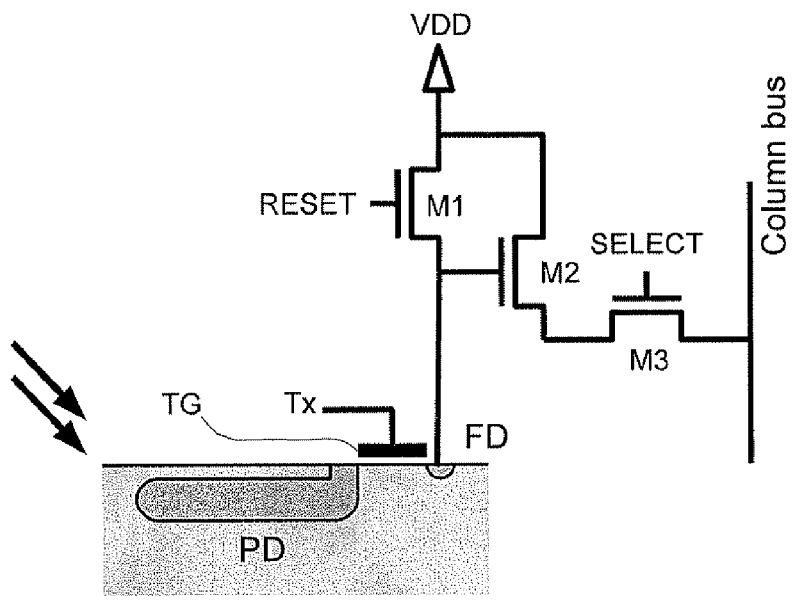
FIG. 1 shows a four transistor (4T) active pixel.
Figure 3:
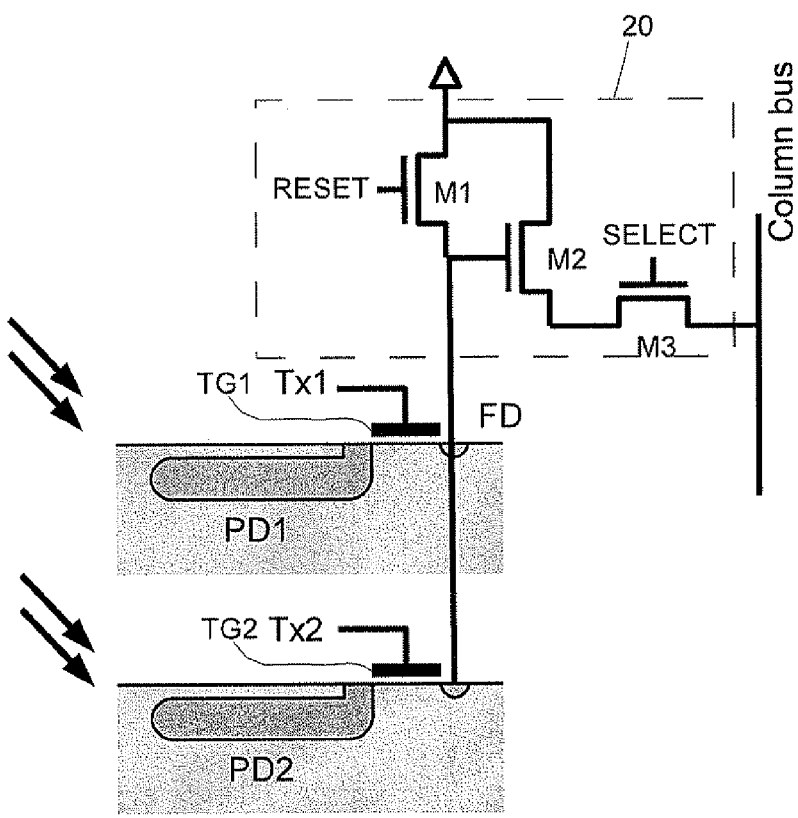
FIG. 3 shows a pair of photodiodes with shared readout circuitry.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Figure 4:
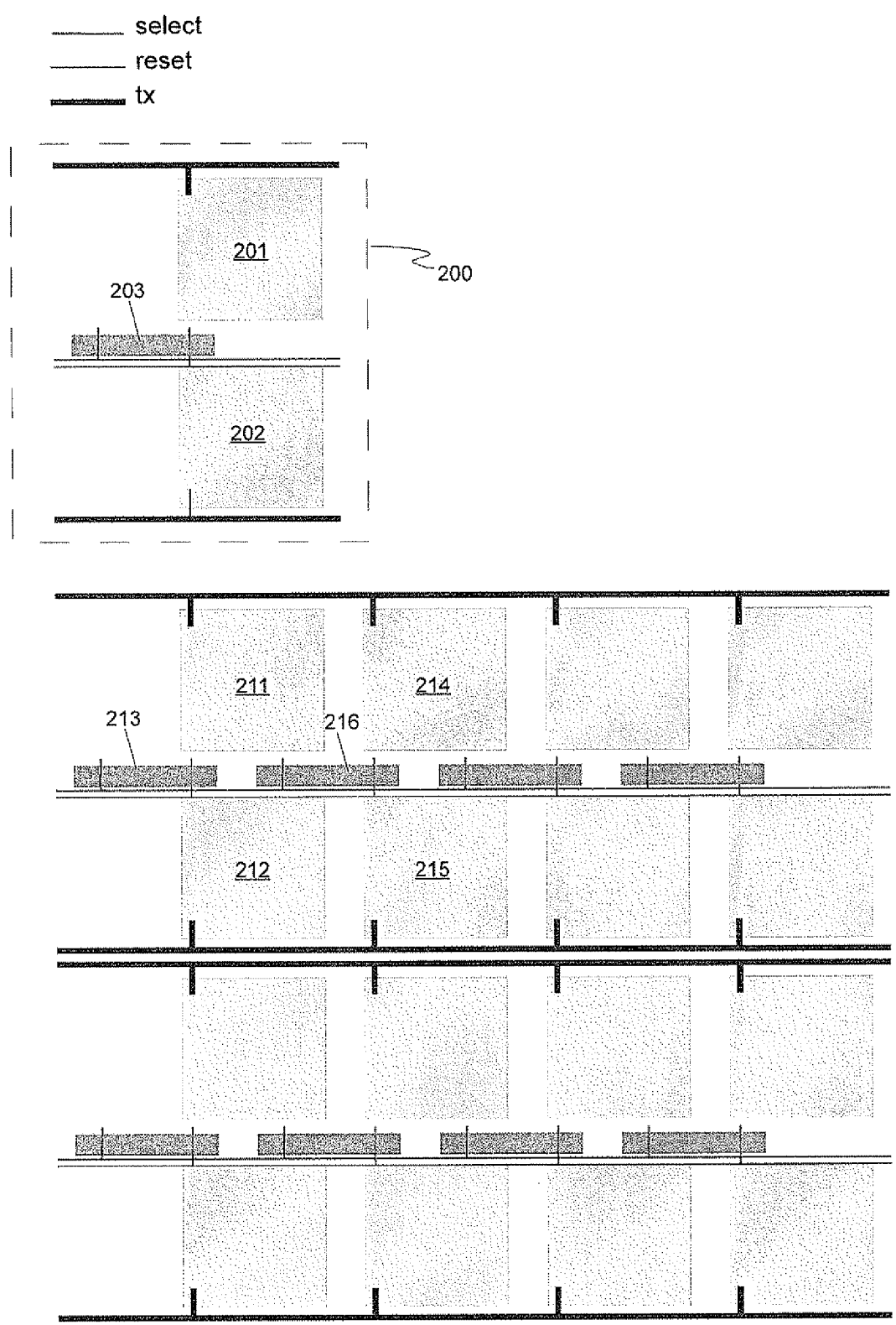
FIG. 4 shows an array of the pixels of FIG. 3.
Figure 5:
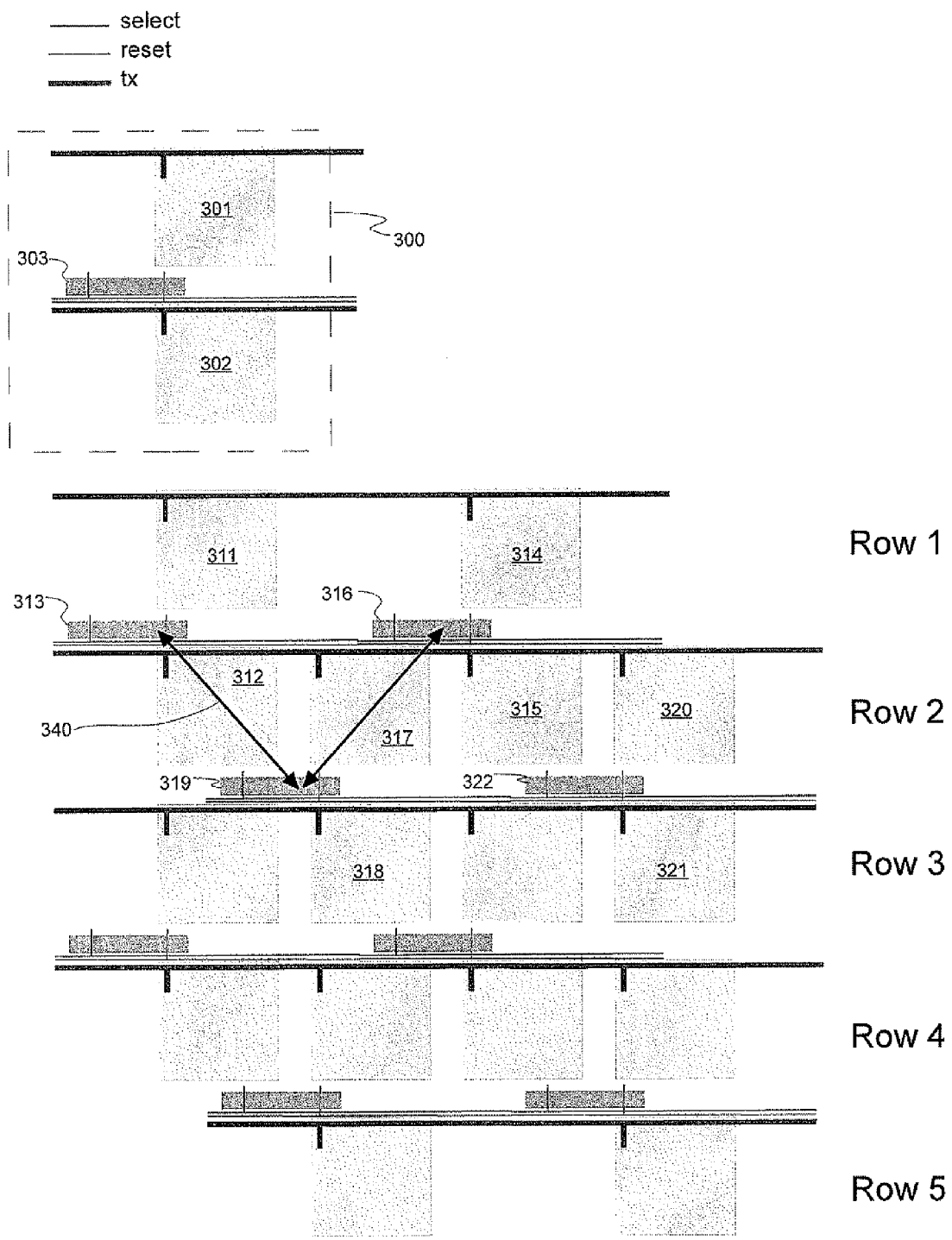
FIG. 5 shows an array of the pixels of FIG. 3 in accordance with an embodiment of the invention.

FIG. 5 shows a pixel architecture with shared readout circuitry provided for each pair of photodiodes. The pixel building block 300 (also called a unit cell) is shown at the top of the Figure. A pair of photodiodes 301, 302 have a shared readout circuitry 303. The shared readout circuitry 303 is positioned between the pair of photodiodes 301, 302 that it serves. The building block 300 has a reset line, a select line, two transfer lines and a single column bus (shown in FIG. 6). The building block 300 is repeated across the array, as shown in FIG. 5, to form an array of a required size. The shared readout circuitry 303 is shown schematically in FIG. 5. The position and/or size of the readout circuitry can differ to that shown in FIG. 5, and later figures give specific examples of how the readout circuitry can be formed in a semiconductor topography. In contrast to the pixel of FIG. 4, where instances of the readout circuitry are aligned along a row, in FIG. 5 the position of the shared readout circuitry is staggered between adjacent rows of the array. Similarly, whereas in FIG. 4 instances of readout circuitry are aligned along a column, in FIG. 5 the horizontal position of the shared readout circuitry is staggered in a "zig-zag" manner between adjacent columns of the array. In FIG. 5, photodiodes 311, 312 are served by readout circuitry 313; photodiodes 314, 315 are served by readout circuitry 316; photodiodes 317, 318 are served by readout circuitry 319; photodiodes 320, 321 are served by readout circuitry 322. It can be seen that each building block 300 is repeated at a position which is horizontally offset by one column and vertically offset by one row from the previous block. The offset between these blocks is shown by the line 340. Similarly, each instance of the readout circuitry is offset by one column, and by one row, from the nearest adjacent readout circuitry. Stated another way, to form a pair of rows, (e.g. Row1, Row2 of FIG. 6) the building block 300 is repeated at a position which is horizontally offset by two columns (i.e. one column is skipped). The next overlapping pair of rows (Row2, Row3) are similarly formed by using building block 300 at positions which are horizontally offset by two columns. The building blocks are positioned in the gaps which were created when forming the previous rows (Row1, Row2).

A control line Tx for controlling transfer gates TG is provided for each row. Control lines Tx are consistently spaced apart by a distance of one row. This differs from the shared layout FIG. 4, where control lines Tx for adjacent rows lie directly next to one another. Spacing the control lines Tx helps to prevent defects which can arise when shorting occurs between adjacent lines.

Figure 2:
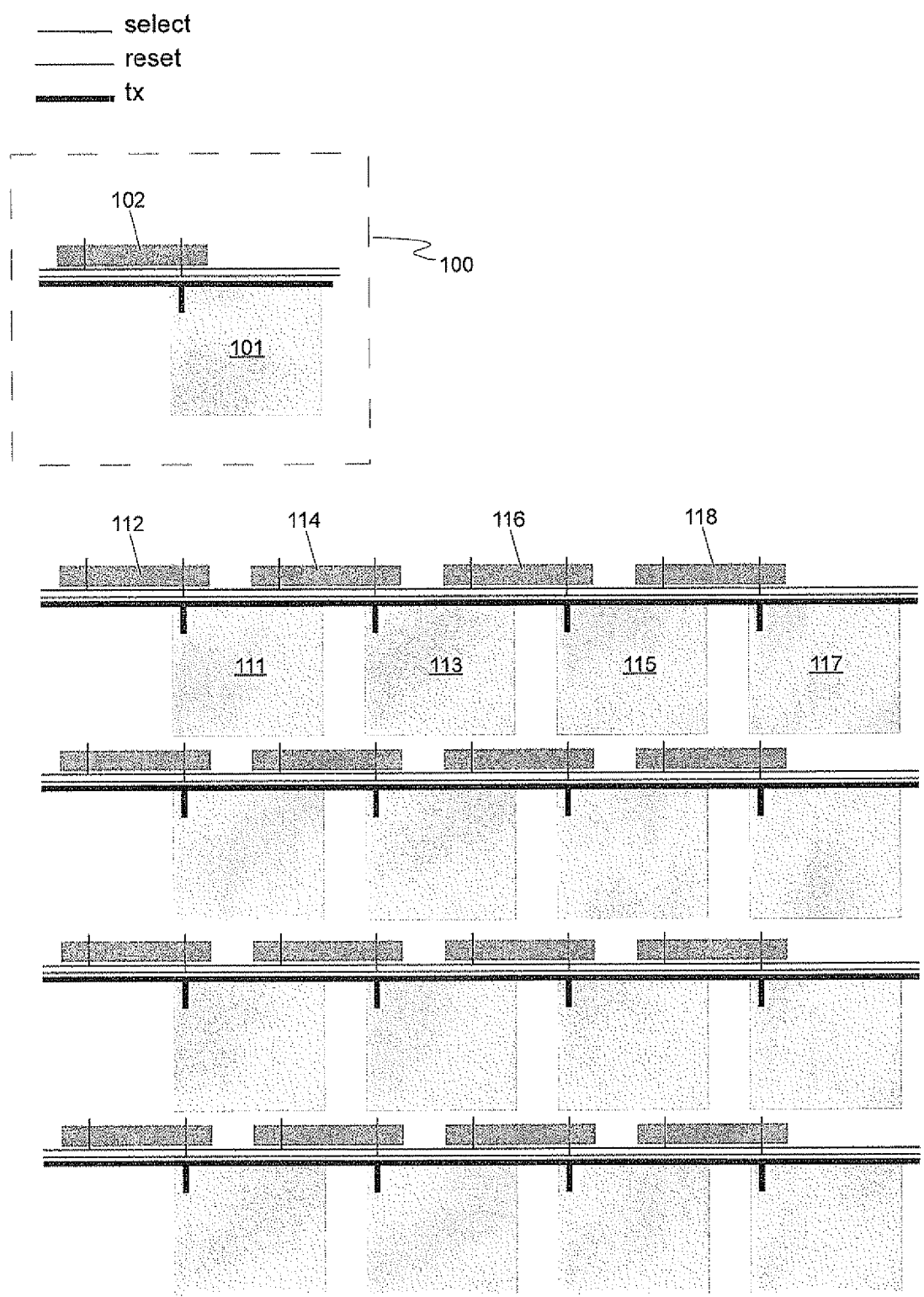
FIG. 2 shows an array of the pixels of FIG. 1.

An advantage of this sharing architecture is that less readout circuitry 313, 316, 319, 322 is required in the pixel array compared to a non-shared architecture. This results in an increased area for photodiodes. A further advantage is that the capacitive load due to junctions and gate capacitances on the column bus, reset lines and select lines is reduced by a factor of two. Compared to the pixel of FIG. 4, it requires three horizontal metal lines be routed per pixel pitch (same as the non-shared pixel shown in FIG. 2) instead of two horizontal metal lines per pixel pitch. Although this latter point may be regarded as a drawback in terms of fill factor and complexity of routing, it can be beneficial for yield, as will be explained more fully later. It will be appreciated that the layout shown in FIG. 5 is repeated across a larger area to form an array of a required size for use in an image sensor.

Figure 6:
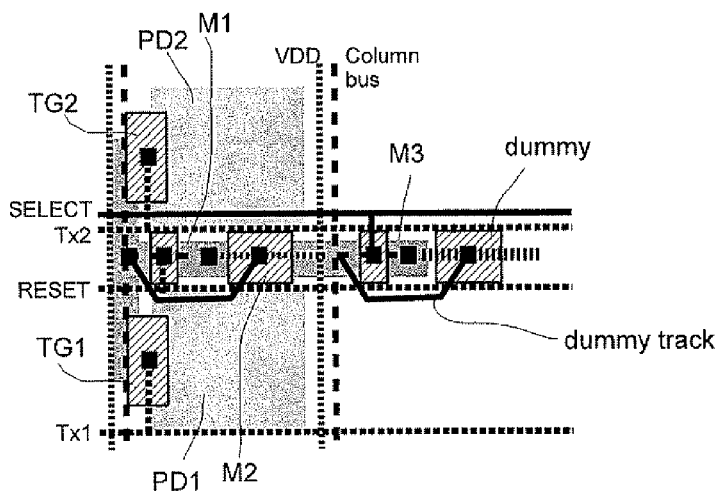
FIGS. 6 and 7 show a manufacturing layout of the array of FIG. 5.
Figure 6:
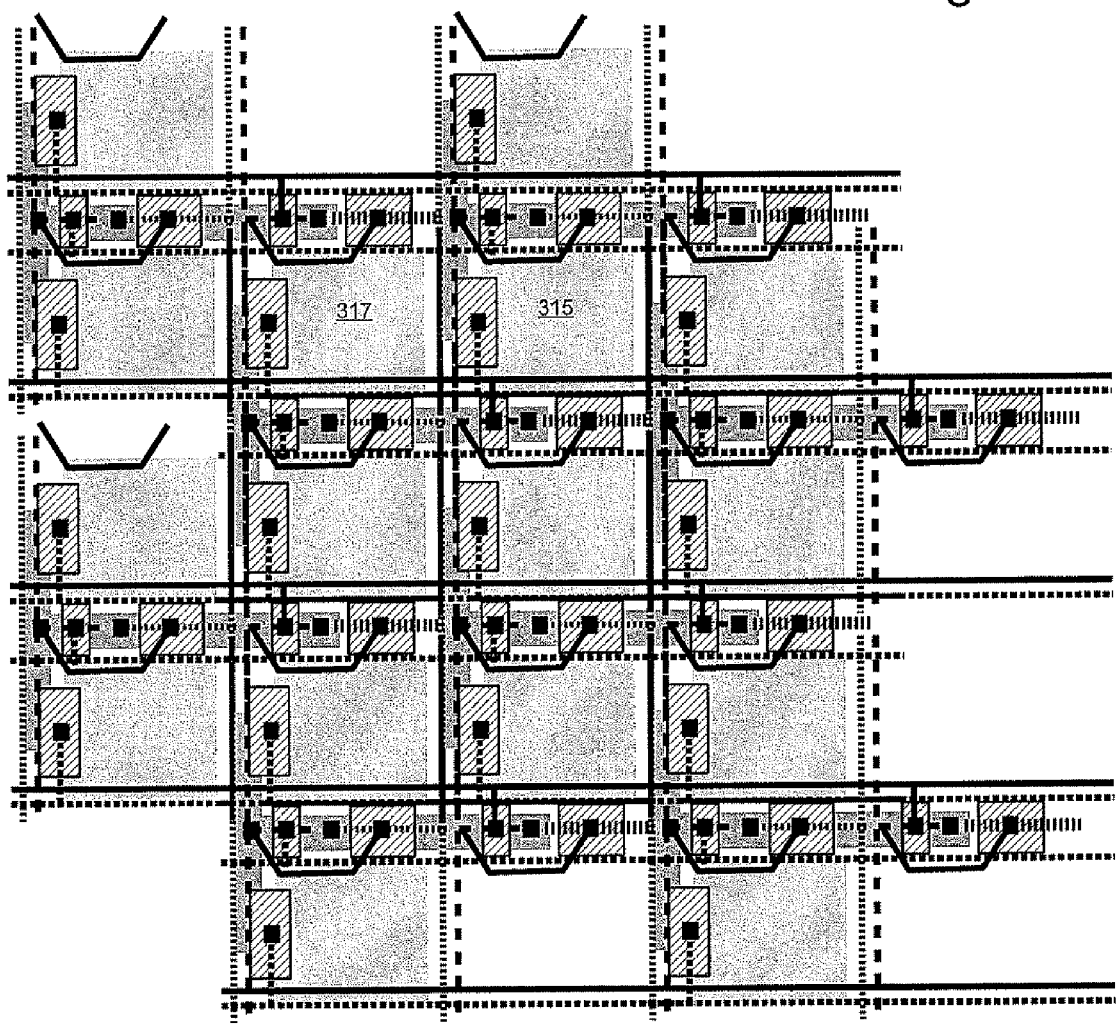
Figure 7:
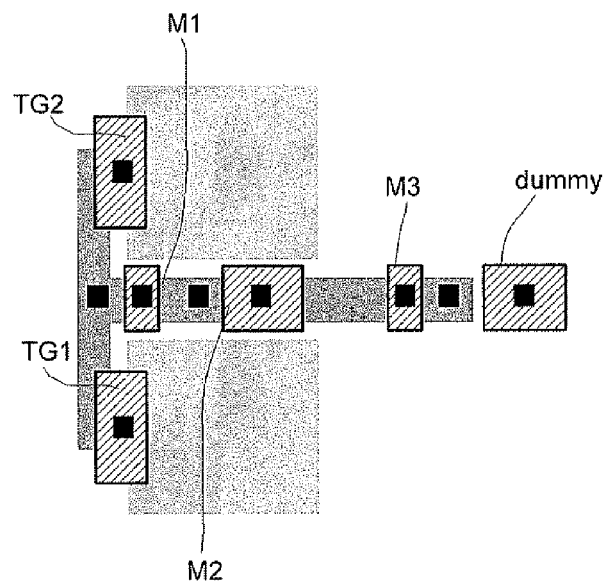
Figure 7:
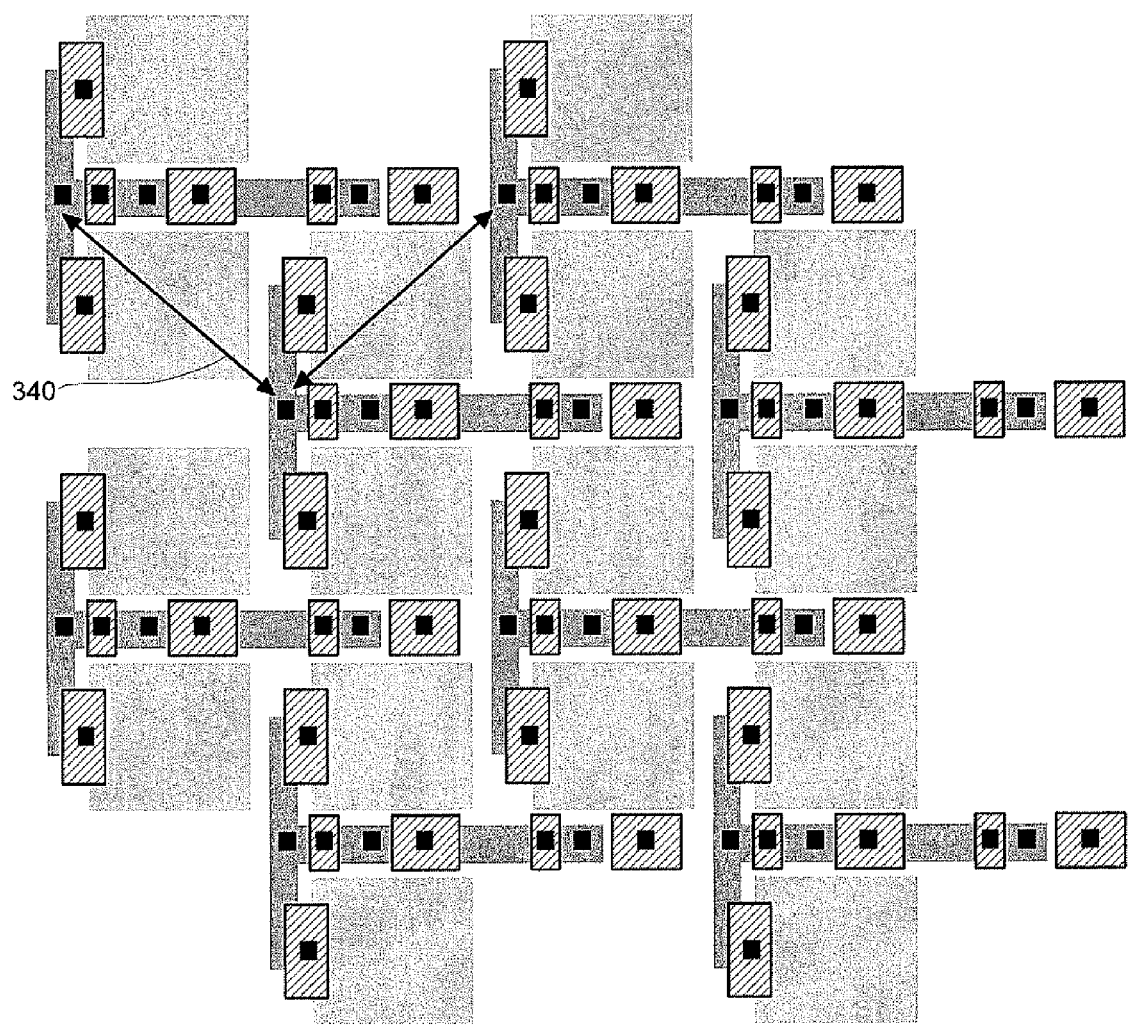

A further advantage of the array is better symmetry. The pixel layout is almost as symmetrical as in the case of the non-shared pixel. Referring to FIGS. 6 and 7, it can be seen that the shared readout circuitry occupies the width of two photodiodes. Reset transistor M1 and the select transistor M3 have the same positions relative to an adjacent photodiode. In the unit cell block at the top of FIG. 6, reset transistor M1 and select transistor M3 are each located at the left-hand edge of adjacent photodiodes. A dummy poly is added to match the relative position of source follower/buffer amplifier M2. M2 and the dummy poly are each located near the right-hand edge of adjacent photodiodes. The metal routing is also made as symmetrical as possible with only minor differences between sharing pixels to avoid different cross talk behaviour. An additional track is connected to the dummy poly to mirror the track connected to M2. The additional poly and track are "dummy" in the sense that the structures are not connected to the other structures of the readout circuitry, and therefore they are non-operational. This arrangement helps to maintain symmetry for the photodiodes of the array, as each photodiode is surrounded by the same set of polys and tracks, located in the same relative positions. This helps to ensure that each photodiode in the array provides a consistent output in response to incident light. This symmetry does not occur when using the sharing approach of FIG. 4. FIG. 7 shows the layout of the array without tracks. Looking at FIG. 7 and considering each photodiode of the array, the semiconductor features above a photodiode are the same as the features below the photodiode. This helps to provide a more consistent output from a photodiode in response to light impinging upon the photodiode from the top and the bottom (i.e. both directions should provide a similar output).

In FIGS. 5 and 6 the readout circuitry is shown aligned with the direction of rows. As an alternative, the readout circuitry can be aligned with the direction of columns.

In FIGS. 5-7 the shared circuitry comprises three transistors: a reset transistor M1, a source follower M2, and a select transistor M3. In FIGS. 6 and 7 the three transistors are manufactured as two groups, each group occupying the width/height of one photodiode (this will be called a pixel pitch). A first group of two transistors (M1, M2) is positioned within one pixel pitch and a second group of transistors (M3, dummy) is positioned within the next pixel pitch. An alternative to the layout shown in FIGS. 6 and 7 is to position the three transistors M1-M3 within a single pixel pitch, i.e. all three transistors M1-M3 are positioned within the width/height of a single photodiode. A set of dummy structures (polys and links) is replicated in the adjacent pixel pitch to preserve symmetry.

Figure 8:
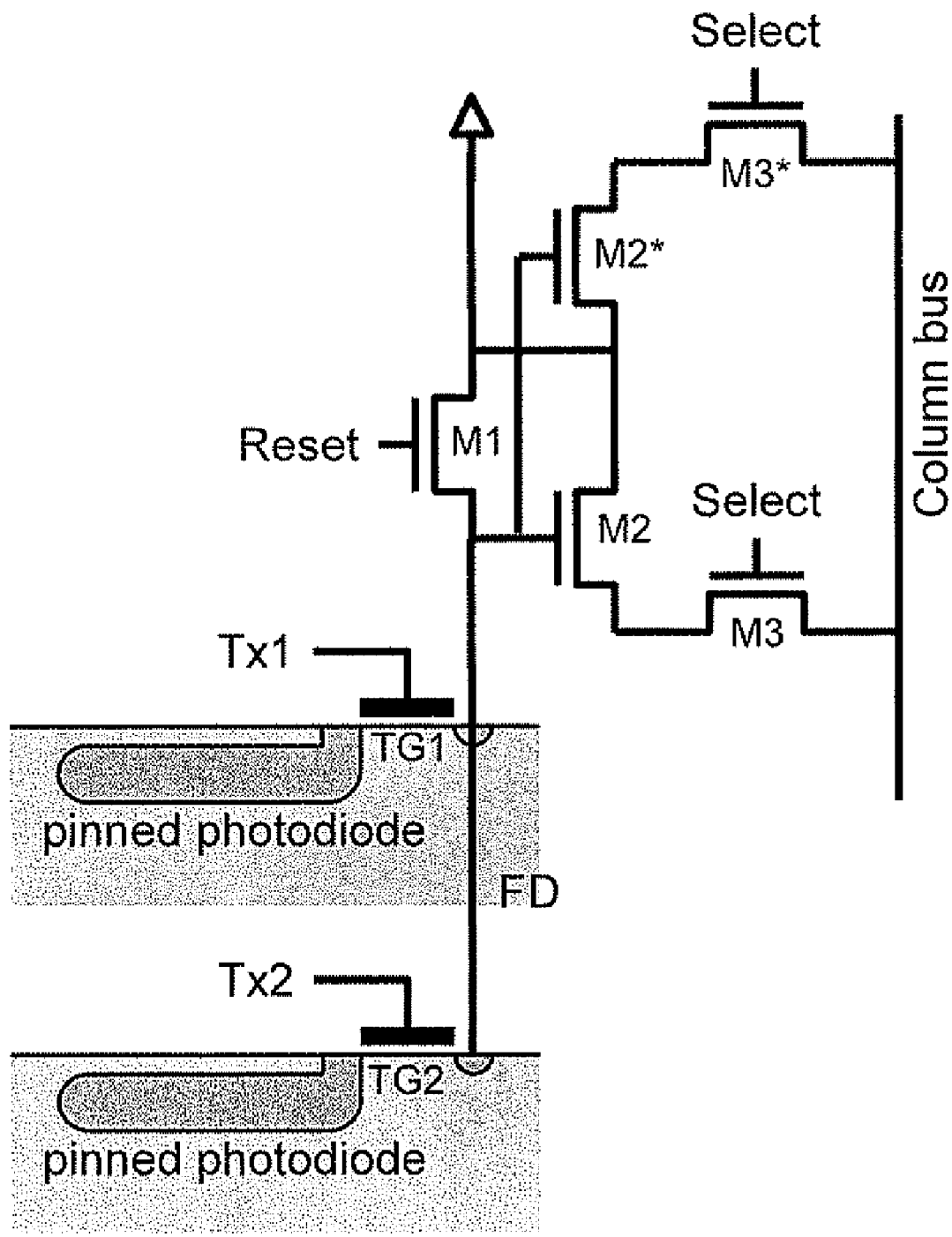
FIG. 8 shows a pair of photodiodes with shared readout circuitry which incorporates some redundancy.
Figure 9:
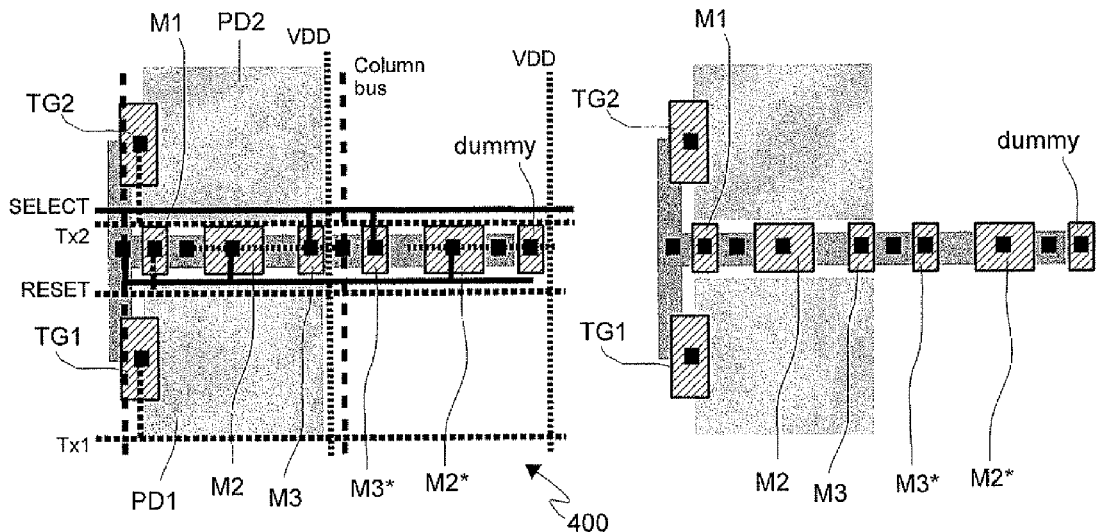
FIG. 9 shows an array of the pixels of FIG. 8.
Figure 9:
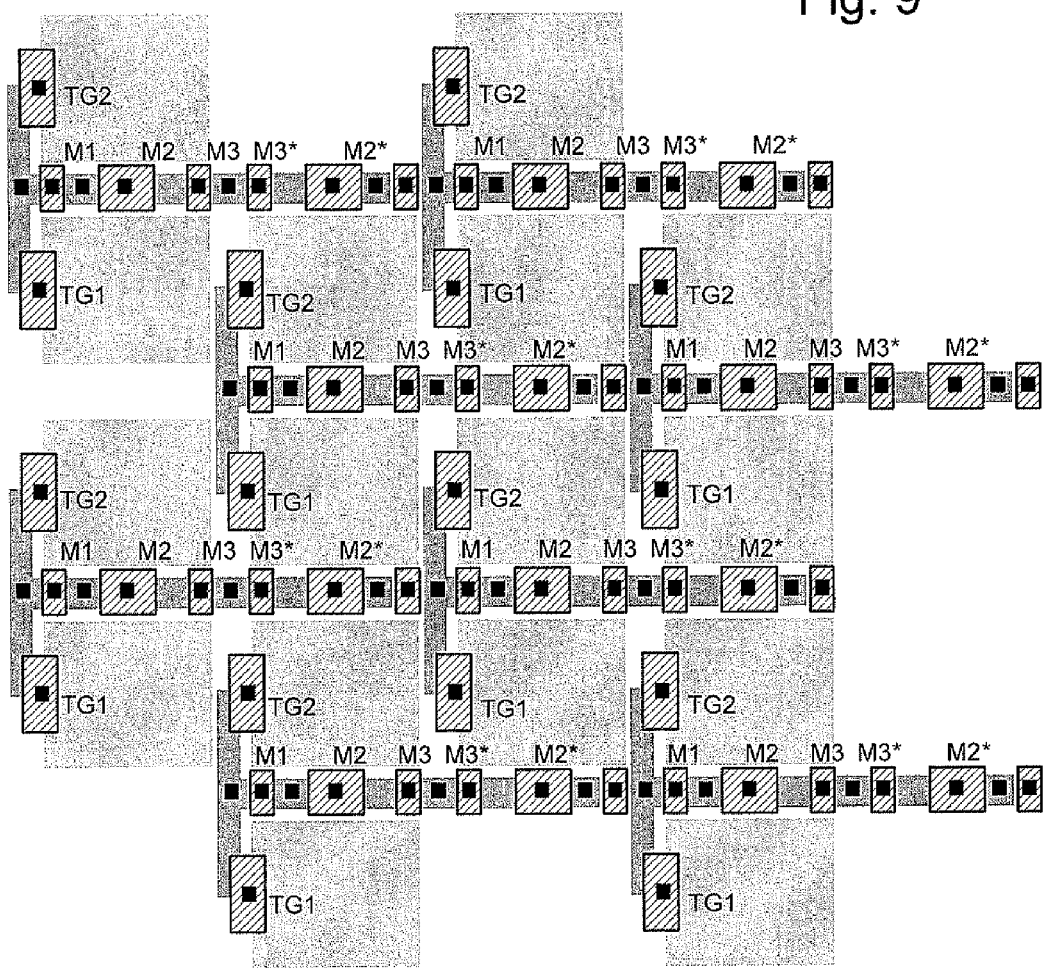
Figure 10:
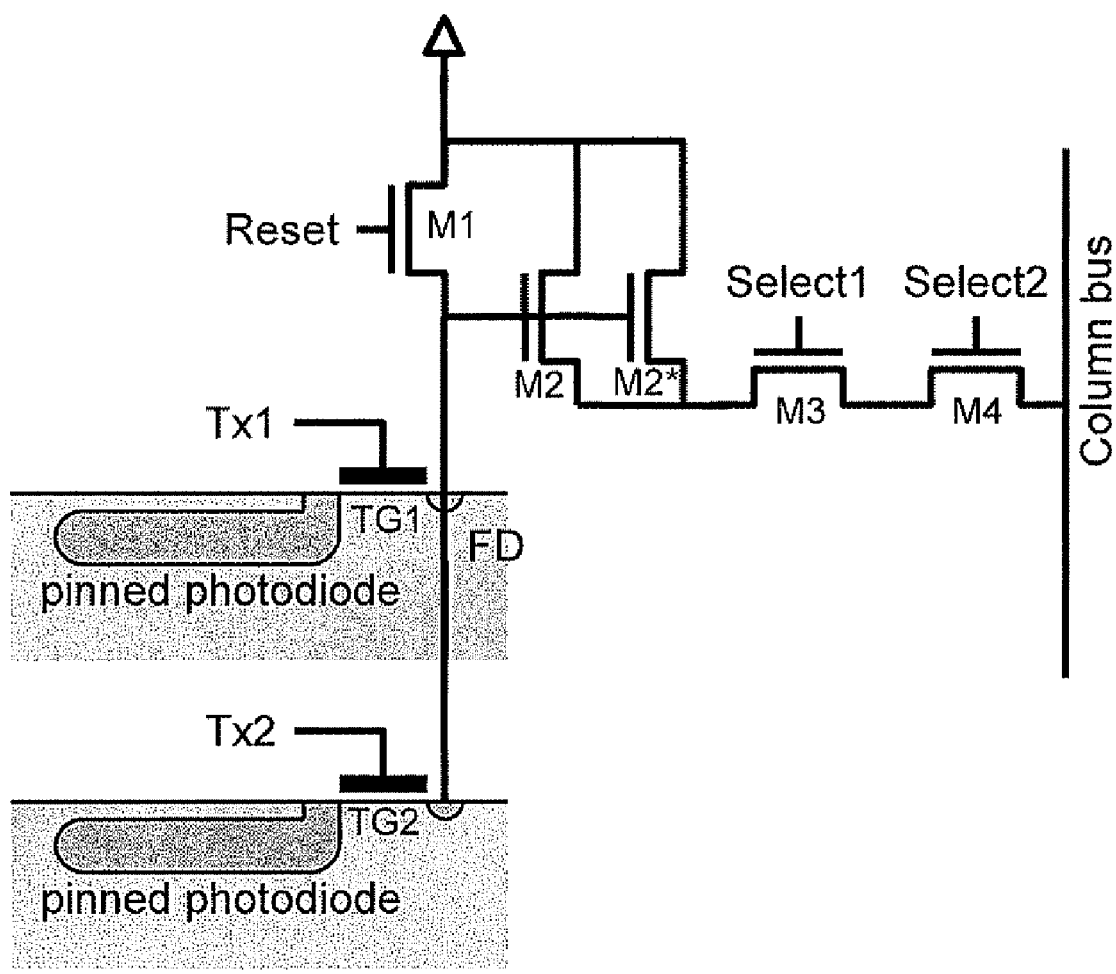
FIG. 10 shows another embodiment of a pair of photodiodes with shared readout circuitry which incorporates some redundancy.

An alternative to forming a set of dummy structures is to use the space for further transistors, which has an advantage of adding redundancy and improving resilience to errors. This further improves the performance of the pixel. FIGS. 8 and 10 show some alternative forms of shared circuitry in which redundancy is provided. FIG. 8 shows two source followers M2, M2* in parallel which can improve speed (more driving strength) and noise performance (lower 1/f noise). There are also two read/select transistors M3, M3* driven from a single select line. FIG. 9 shows an array formed of a unit block 400 which corresponds to the schematic shown in FIG. 8. Unit block 400 comprises two photodiodes PD1, PD2 each having a respective transfer gate TG1, TG2. The transistors of the readout circuitry are arranged in two groups. A first group comprises the transistors M1, M2 and M3. The second group comprises the transistors M3*, M2* and a dummy poly. The first and second group have the same physical appearance and the same positions relative to the adjacent photodiodes. This gives the same optical response to the photodiodes which are adjacent to the two groups of transistors.

Figure 11A:
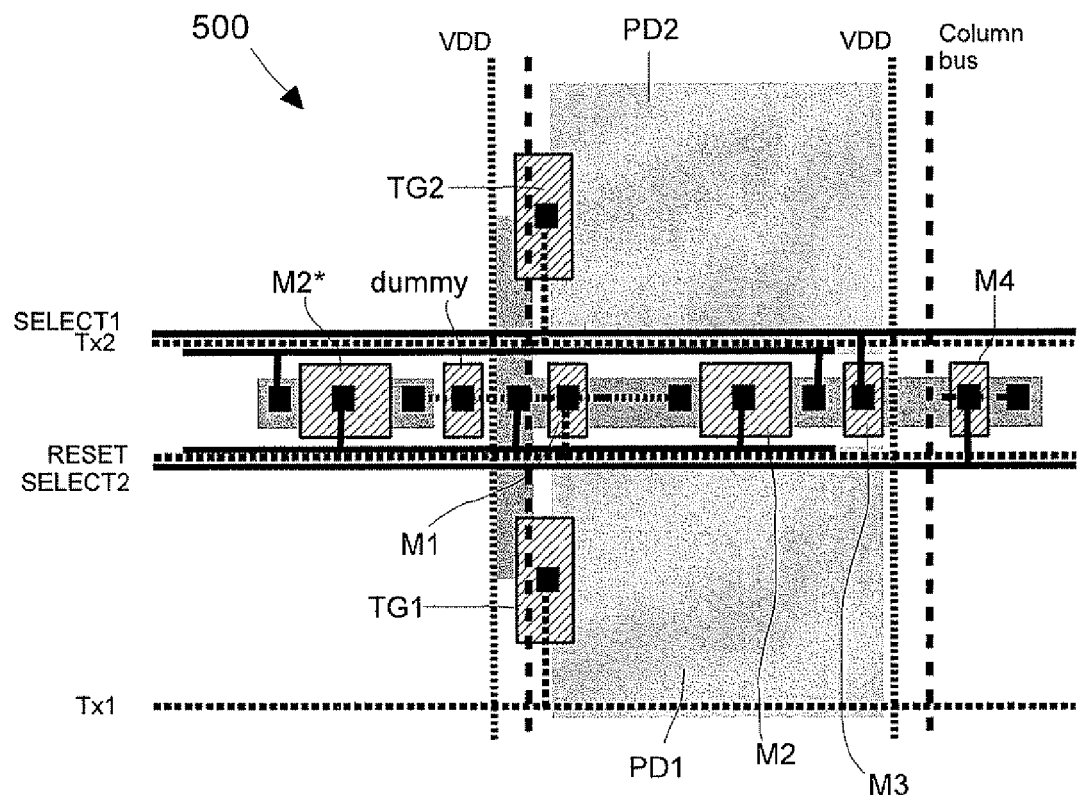
FIGS. 11A and 11B show the circuitry of FIG. 10 as a unit cell which can be replicated to form an array.
Figure 11B:
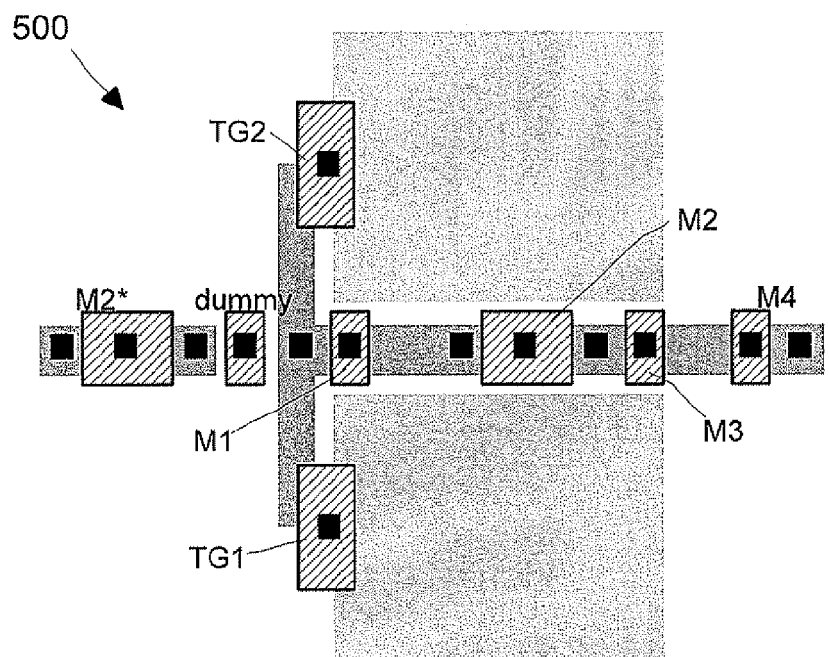
Figure 12:
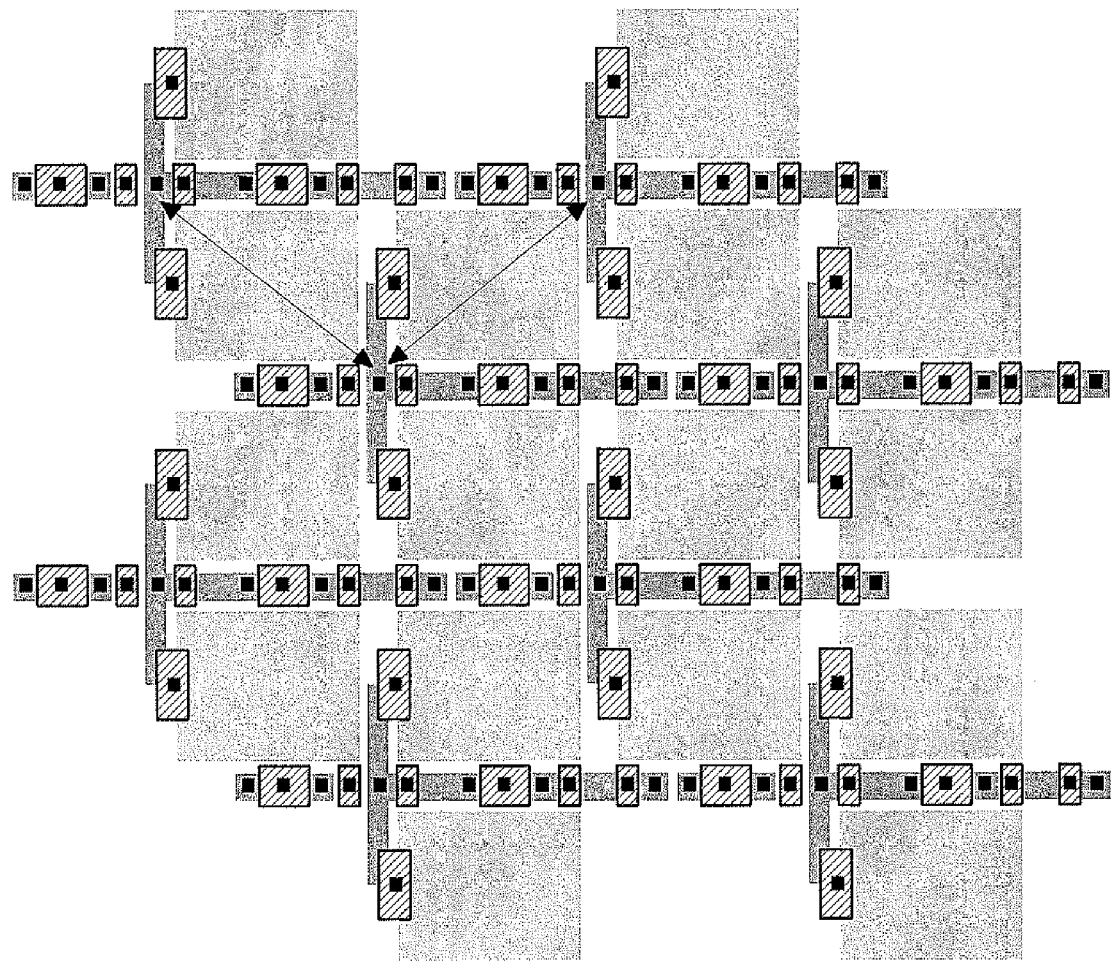
FIG. 12 shows an array of the pixels of FIGS. 10 and 11.

FIG. 10 shows two source followers M2, M2* in parallel. Two read/select transistors M3, M3* are arranged in series and are driven by two separate lines Select1, Select2. This can be used to improve final sensor yield as if one of the select lines is stuck to VDD, the sensor can still operate correctly via the second select transistor and select line. FIG. 11A shows a unit block 500 with metal routing and FIG. 11B shows the same unit block without metal routing. Unit block 500 comprises two photodiodes PD1, PD2 each having a respective transfer gate TG1, TG2. The transistors of the readout circuitry are arranged in three groups. A first group comprises the transistors M1, M2 and M3. The second group comprises the transistor M2 and a dummy poly. The third group comprises the transistor M4. When the unit block 500 is repeated to form the array, the second group (M2, dummy) and third group (M4) abut one another to give the same physical appearance as the first block. This is best shown in FIG. 12. The first group and the second and third groups have the same physical appearance and the same positions relative to the adjacent photodiodes. This gives the same optical response to the photodiodes which are adjacent to the two groups of transistors. FIG. 12 shows an array formed of the unit block 500. For clarity, the metal routing is not shown.

Figure 13A:
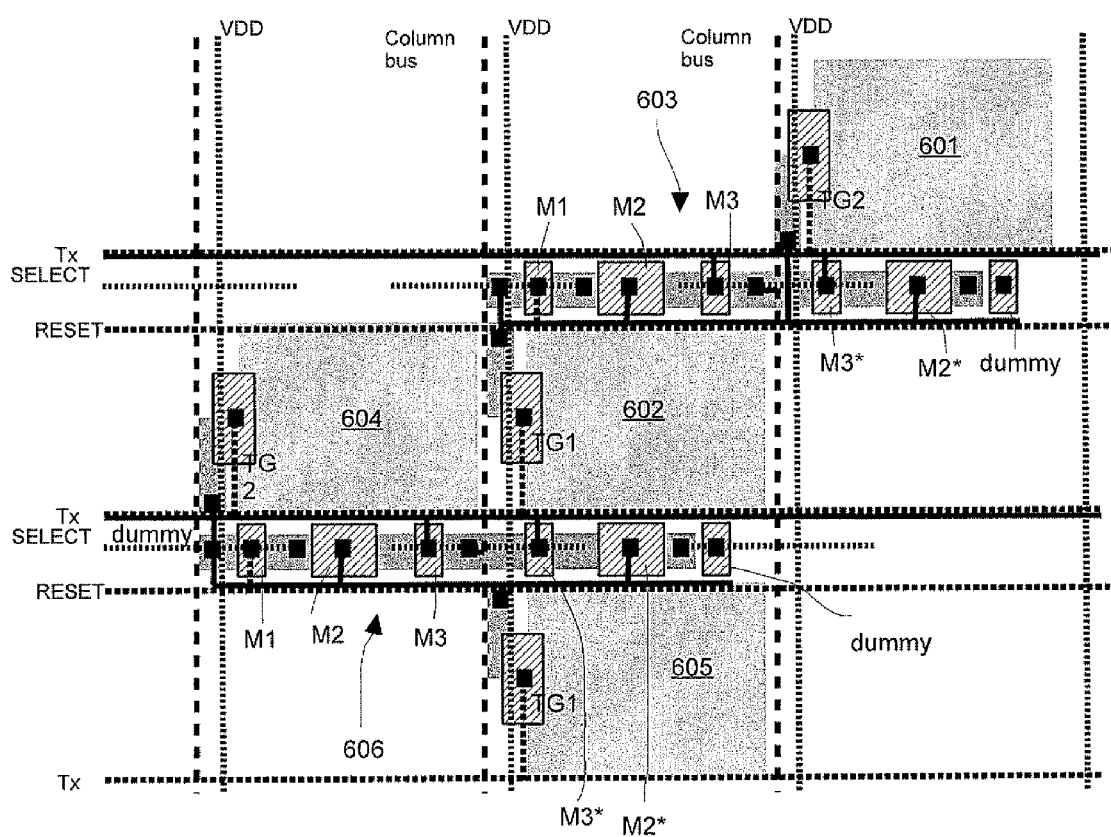
FIGS. 13A and 13B show a further unit cell which can be replicated to form an array, the unit cell serving diagonally positioned photodiodes.
Figure 13B:
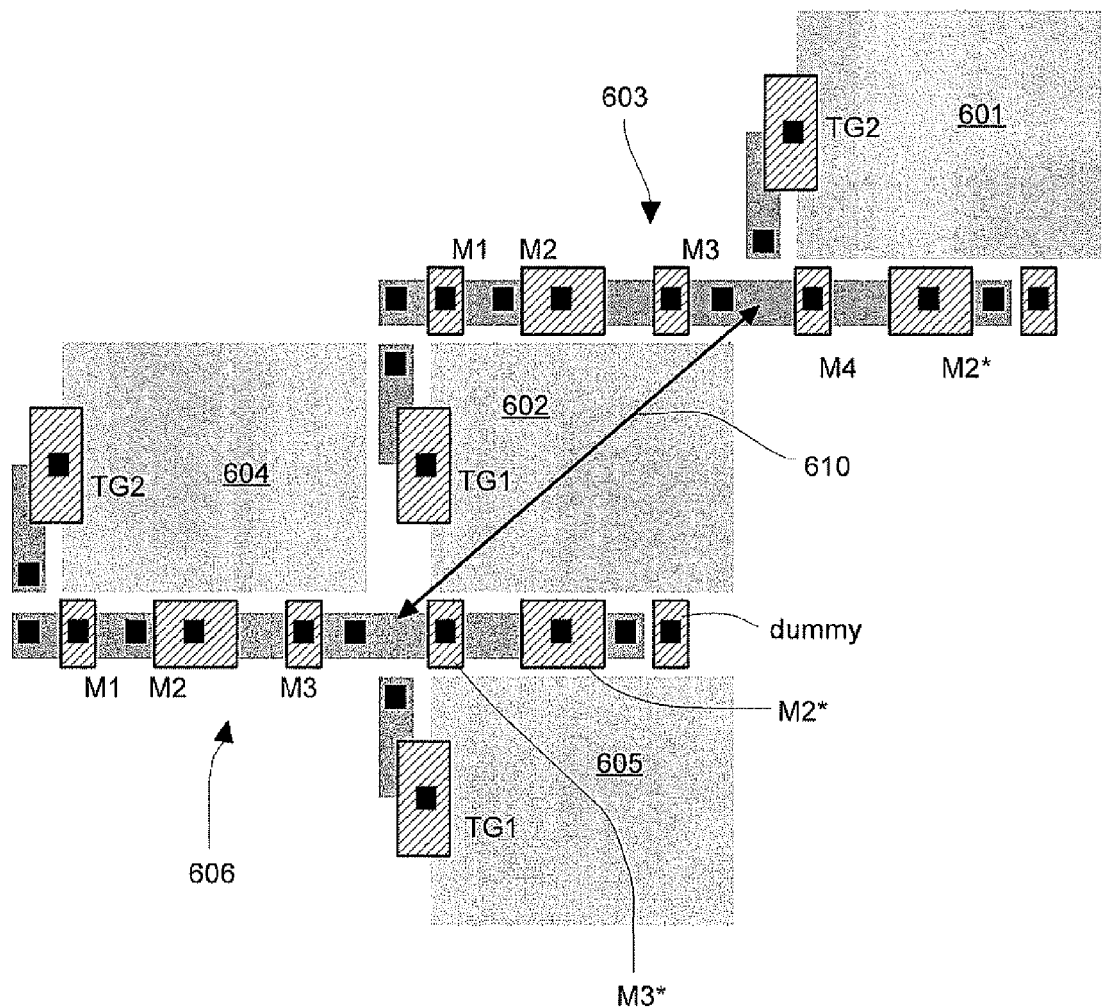
Figure 14:
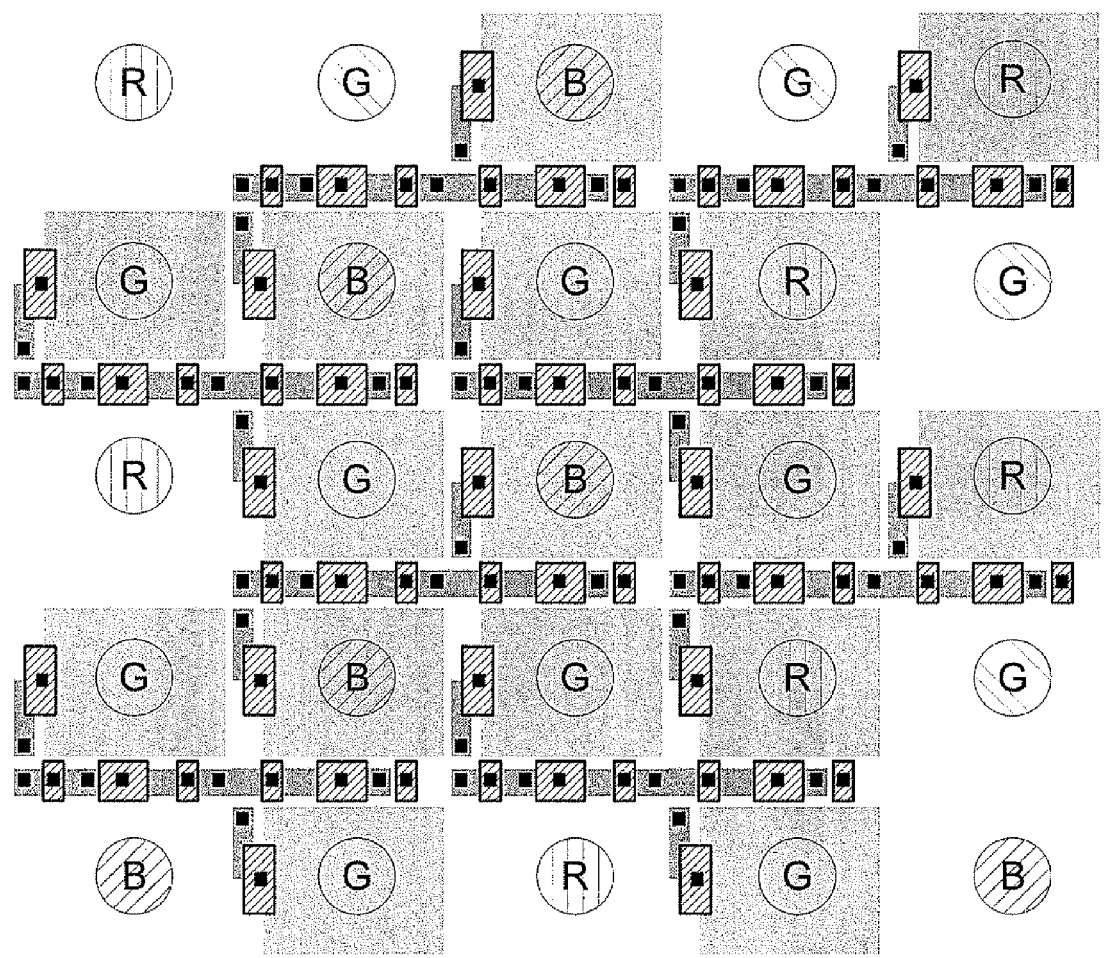
FIG. 14 shows an array of the pixels of FIG. 13B with a colour filter pattern.

In the embodiments shown in FIGS. 5-12 shared readout circuitry is positioned between two vertically aligned photodiodes. FIGS. 13A-14 show an embodiment with a pair of diagonally-positioned photodiodes sharing readout circuitry. FIG. 13A shows a unit cell with metal routing. FIG. 13B shows the same unit cell without metal routing. The unit cell comprises two pairs of photodiodes, and two sets of readout circuitry. A first pair of photodiodes 601, 602 is served by readout circuitry 603. A second pair of photodiodes 604, 605 is served by readout circuitry 606. Readout circuitry 603 is horizontally offset from readout circuitry 606 by a distance 610 of one column and vertically offset by one row, as shown by line 610. In this embodiment, the layout of readout circuitry 606 is mirrored in the horizontal (row) axis compared to readout circuitry 603. This embodiment with diagonally arranged photodiodes is particularly useful for colour imaging applications. FIG. 14 shows one example of an array layout using the unit cell of FIG. 13B, with a colour filter overlaid upon the array. The colour filter shown in FIG. 14 is slightly modified from the conventional Bayer colour filter pattern such that a pair of photodiodes which share readout circuitry have the same colour filter overlaid upon them. This allows for binning of similarly coloured pixels. Binning is performed by operating the transfer gates to transfer charge from both photodiodes (representing the same colour) to the sense node and outputting a single output value representing the combined charge of both photodiodes. Other colour filter patterns can be used.

Yield Considerations

An important consideration of image sensor production is yield, i.e. the number of pixels in the array which can be used. A defect pixel can be caused by various production issues, which will put the pixel out of specification in some way. In the event that a pixel is defect, it may be possible to correct the pixel by using an interpolation scheme which makes use of the outputs of neighbouring pixels. One example correction scheme requires that for being correctable the pixel must have:

- two non-defect neighbours out of the four horizontal and vertical neighbours (not necessarily located on the same axis); or
- two diagonal non-defect neighbours, both located on the same diagonal crossing the (defect) pixel.

Figure 15:
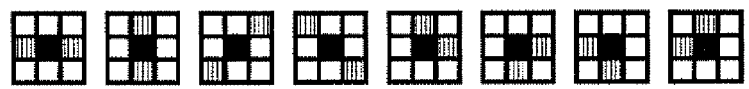
FIG. 15 shows correction patterns for defect pixels.

FIG. 15 shows possible correction patterns. Defect pixels (shown as solid black squares) are correctable using the pixels shown as shaded squares. This definition of a correctable pixel allows 2×2 clusters, 3×2 clusters are not allowed. However, 5 defect pixels on a 3×2 window are allowed.

Figure 16:
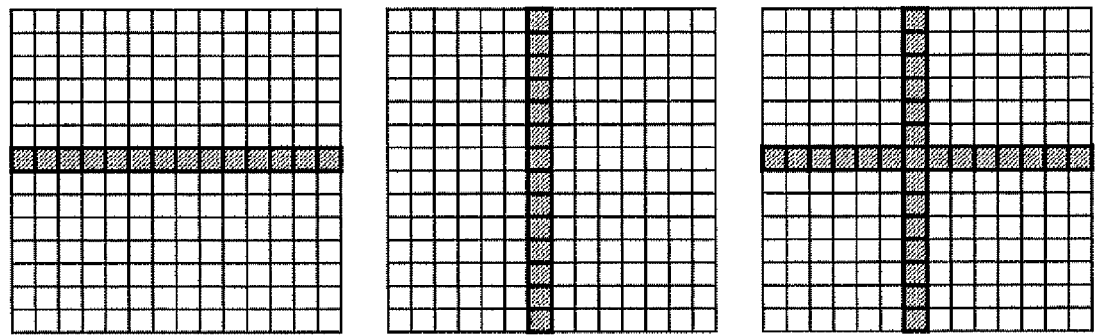
FIG. 16 shows correctable pixels in the array of FIG. 2.
Figure 16:
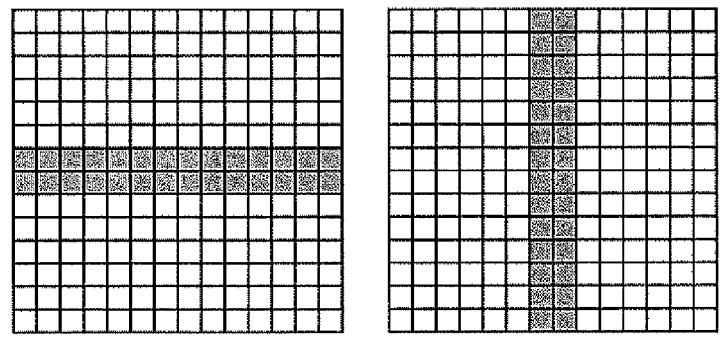

FIG. 16 illustrates how defect lines (either reset, transfer and/or select lines in horizontal direction and column bus or power supply lines in vertical direction) translate into defect pixels on the sensor. A small pixel array is shown as an illustration. Defect pixels shown as shaded squares are correctable pixels according to the above definition, while defect pixels shown as solid squares are not correctable.

Figure 17:
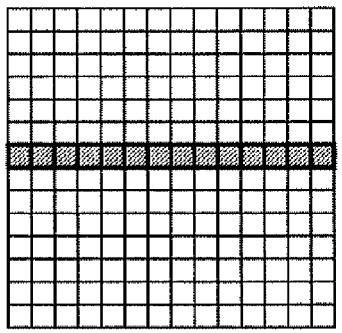
FIG. 17 shows correctable pixels in the array of FIG. 4.
Figure 17:
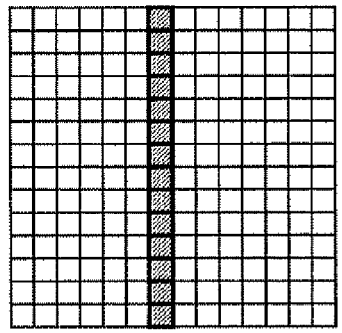
Figure 17:
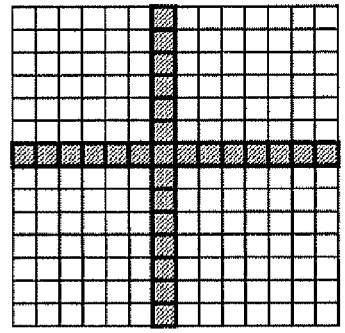
Figure 17:
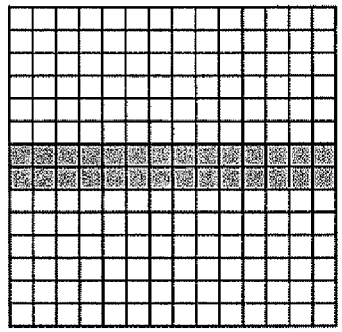
Figure 17:
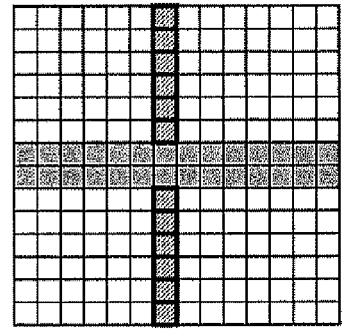
Figure 17:
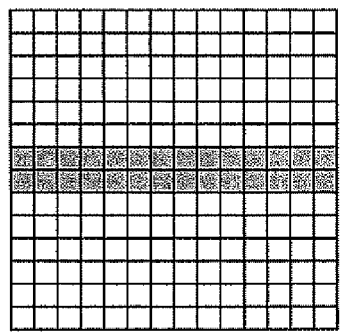
Figure 17:
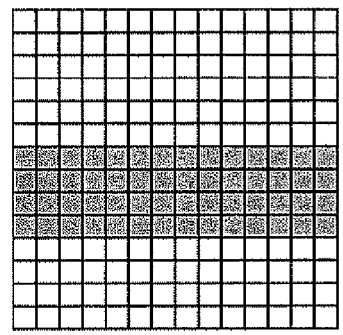
Figure 17:
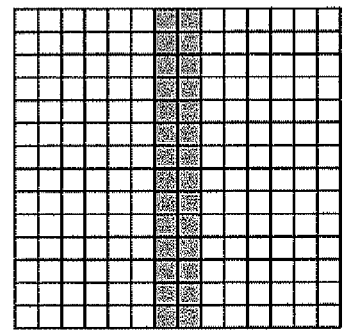

FIG. 17 illustrates how defect lines translate into defect pixels on the sensor in the case of a conventional pixel sharing approach as shown in FIG. 4. As call be seen, a single defect reset or select line results in two non-correctable defect lines. A single defect transfer line results in a correctable defect line, however, two adjacent transfer lines result in two non-correctable defect lines. The probability for such two adjacent defect transfer lines is higher than for the standard non-shared pixels since the transfer lines in this shared approach are closely spaced in the layout. Two adjacent defect reset/select or column/power supply lines result immediately in four adjacent non-correctable lines, but one has to take into account that two adjacent lines with the same functionality reside at two times the pixel pitch (but defects can also arise by shorts between two lines with different functionality). Defect pixels shown as solid squares are correctable pixels according to the above definition, while defect pixels shown as shaded squares are not correctable.

Figure 18:
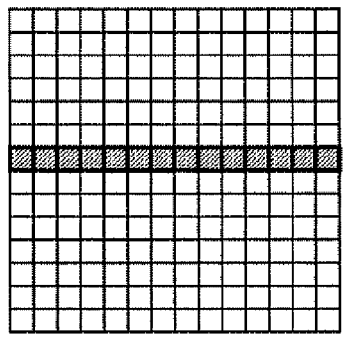
FIG. 18 shows correctable pixels in the array of FIG. 5.
Figure 18:
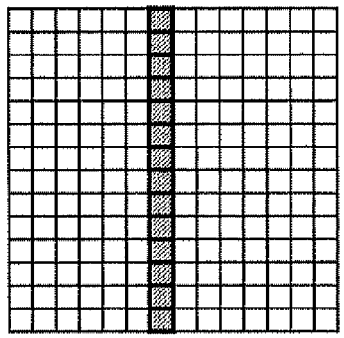
Figure 18:
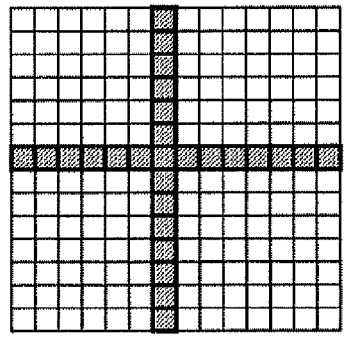
Figure 18:
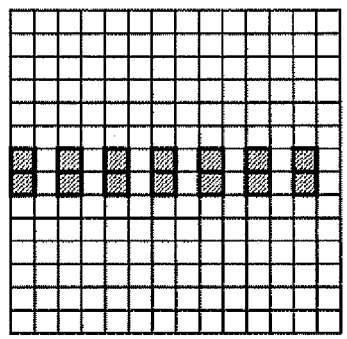
Figure 18:
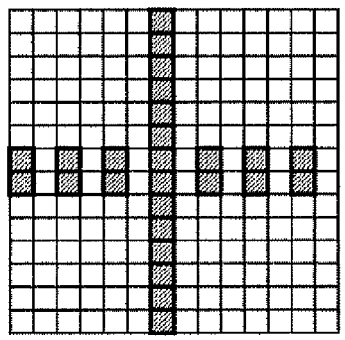
Figure 18:
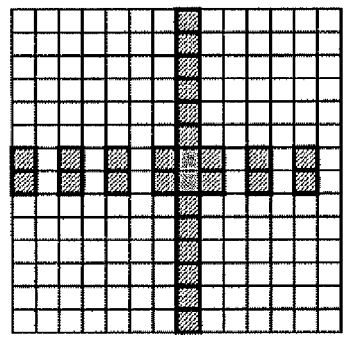
Figure 18:
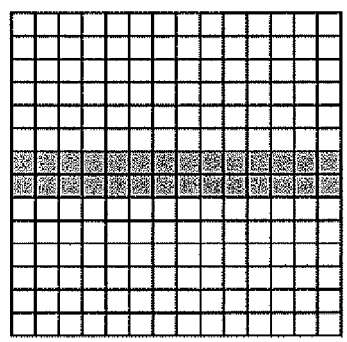
Figure 18:
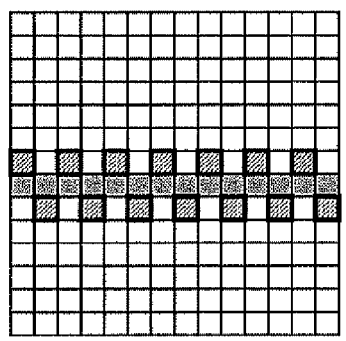
Figure 18:
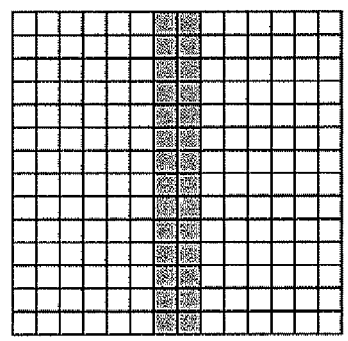

FIG. 18 illustrates how defect lines translate in defect pixels on the sensor in case of the pixel sharing approach shown in FIG. 5. As can be seen, a single defect transfer line results in a different defect pixel configuration as a single defect row/select line. A single defect line results in most cases in a single correctable defect line. Note that in one of two cases a single defect row/select line combined with defect column results in two non-correctable pixels at the crossing. This is a significant improvement over the yield results obtained with the conventional sharing arrangement. One contributing factor to the improvement in yield is that the number of control lines is not reduced in FIG. 5. Each row of pixels is served by a reset line, a select line and a transfer line. The consistent spacing of transfer gate control lines apart by one row also improves yield, and improves symmetry.

Figure 19:
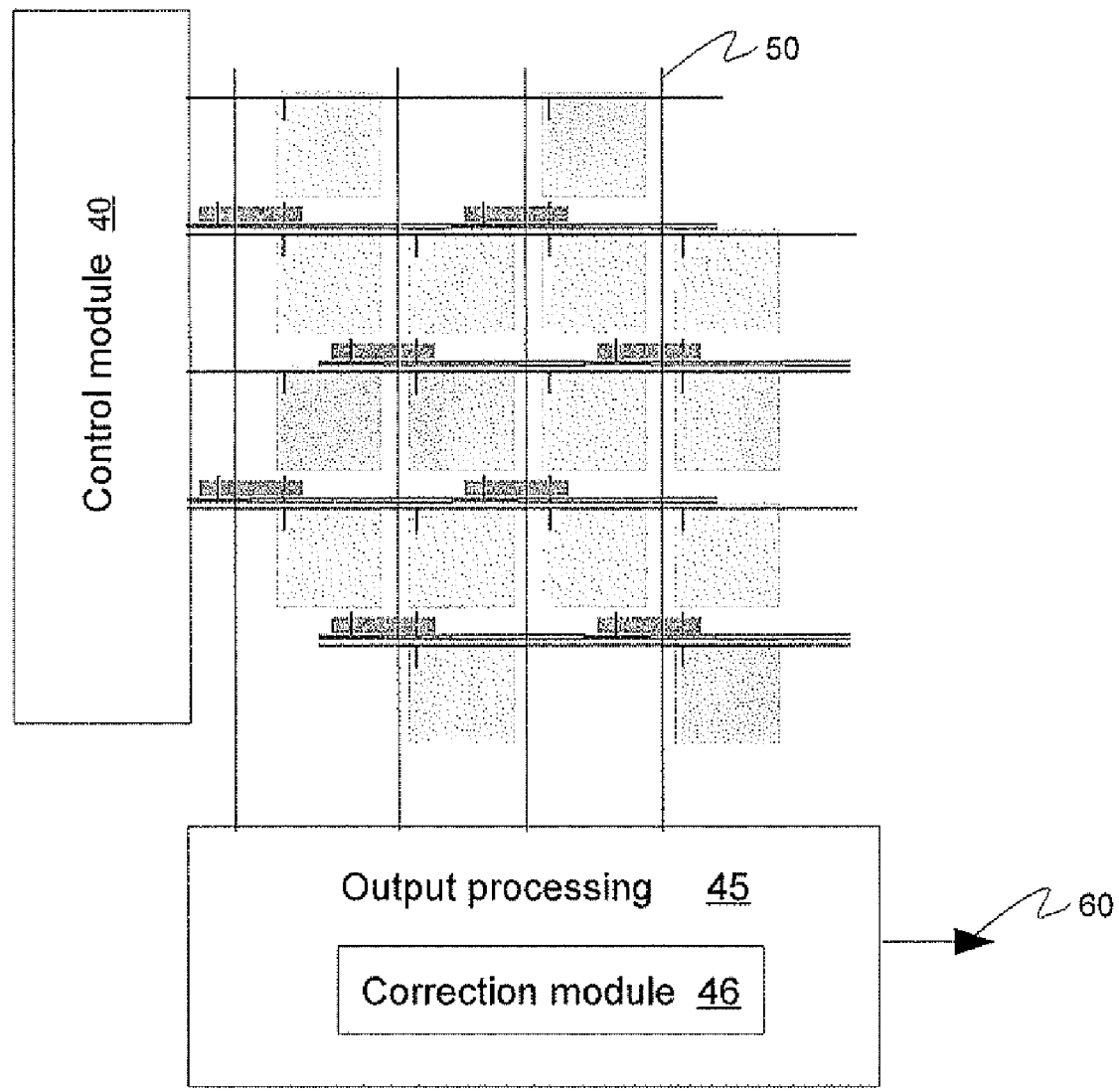
FIG. 19 shows an image sensor comprising an array of pixels.

FIG. 19 shows an image sensor apparatus comprising an array of pixels of FIG. 5 and additional circuitry. Control lines (SELECT, RESET, Tx) span the array and connect to readout circuitry of the array, and to transfer gates of the individual photodiodes. The control lines are driven by control logic 40. Column buses 50 connect readout circuitry to an output processing stage 45. Typically, the output processing comprises column amplifiers, analog-to-digital converters (ADCs) and multiplexers. Pixels are read column-by-column, with a row of pixels simultaneously outputting pixel data to a column amplifier and ADC. The output processing can perform double sampling, or correlated double sampling (CDS), to improve accuracy. A correction module 46 applies a correction pattern or algorithm to the image data which calculates a pixel value for defect pixels of the array, based on surrounding pixel values, as previously described. The defect pixels may be known in advance (e.g. as a result of a test performed at the time of manufacture) or may be discovered by the apparatus as a result of a test during operation.

In FIG. 5 a layout is shown in which readout circuitry is positioned between two adjacent photodiodes in a column. In an alternative embodiment, the shared readout circuitry serves a pair of photodiodes in a row, with the shared readout circuitry being positioned between, or above, the pair of photodiodes. This requires a different arrangement of transfer gate control lines to that shown in the Figures.

In the embodiment shown in FIG. 5 the shared readout circuitry includes a full set of shared components to output a signal from a photodiode. Each photodiode requires a dedicated transfer gate, which cannot be shared. In the embodiments of FIGS. 8 and 10 the shared readout circuitry includes additional components to improve redundancy. It is also possible that the shared readout circuitry comprises a smaller set of components than shown in FIG. 5, and that components are provided for each photodiode. For example, the select switch can be removed in some shared-pixel architectures (se e.g. US 2006/0208163). As another example, each photodiode can be provided with a dedicated buffer amplifier/source-follower M2 and a reset transistor M1, while the shared readout circuitry can comprise two select switches arranged in series.

Colour Filter Interpolation

With groups (e.g. pairs) of photodiode pixels having shared readout circuitry, it is possible to bin together charges from the group of photodiodes that are connected via their transfer gate to the same floating diffusion (sense node). If the transfer gates of these pixels are both pulsed concurrently, the charge from the two pixels will be added on the floating diffusion. This technique can be used in 2×2 shared colour pixels with a Bayer colour filter pattern to reconstruct a monochrome image at ¼ of the resolution. However, to reconstruct a colour image in binned mode, there is typically a problem that charges of different colours are binned together, thereby destroying the colour information.

The staggered shared pixel architecture described above allows binning together charges of different colour channels whilst preserving the colour data. Colours can be reproduced through a set of three primary colours (red, green and blue, referred to as R, G and B), or by complementary colours (yellow, cyan and magenta, referred to as Ye, Cy, Mg). These complementary colours are sometimes also referred to as secondary colours. In other occasions, the RGB system is called the additive system (as colours are reproduced by mixing and adding red, green and blue light), and the YeCyMg system is referred to as subtractive colour system (as colours are reproduced by filtering though a set of Ye, Mg and Cy filters). Subtractive systems are popular in printing systems, whilst additive systems are popular in displays. The colours relate to each other by the following equation set:

$$Cy = G + B$$

$$Mg=R+B$$

$$Ye=R+G$$

In an image sensor, the pixel array is covered by a set of primary or complementary colour filters, in a repetitive colour filter array (or CFA) pattern. FIG. 14 showed a colour filter array pattern applied to a staggered shared pixel array in which diagonally arranged pairs of photodiodes share readout circuitry. Each pair of diagonally-arranged photodiodes are overlaid with a filter of the same colour, allowing binning of the same colour. The filter patterns in FIGS. 20 and 23 show other examples of CFA repetitive patterns (or kernels) of primary colour filters that can be repeated over the staggered shared pixel array. In these examples it is assumed that the staggered shared pixel array comprises readout circuitry shared by a pair of photodiodes in the same row. The CFA patterns can also be applied to staggered shared pixel arrays with readout circuitry shared by a pair of photodiodes in the same column by rotating the CFA pattern through 90 degrees.

In a normal readout of the shared pixels, without binning, the data obtained from the pixel array is as shown in FIGS. 21 and 24. The colour image is reconstructed through a colour filter interpolation algorithm, which reconstructs the missing R, G or B data from data of neighbouring pixels. When binning is enabled on the shared pixel array, the resulting image is composed of complementary colours and shown in FIG. 22. The dashed boxes in FIG. 21 indicate which pairs of photodiodes are binned together. A colour filter image at half resolution can be reconstructed from the Ye, Cy and Mg data of the binned pixels. This means that colour data can be reconstructed even in charge binning mode. The pattern of FIGS. 20 and 23 both allow this and other equivalent patterns can exist. The pattern of FIG. 20 is advantageous for several reasons. First, this pattern has the advantage of a shorter distance for the colours to be interpolated in each pixel in full resolution. Each pixel has at least 3 neighbours of the missing colour filters. Secondly, the array of FIG. 20 has no vertical or horizontal lines of a single colour (as the green columns in FIG. 24). This is an advantage, since certain vertical or horizontal fine coloured objects typically exist in an imaging scene and they may generate false colours or colour filter array interpolation artefacts in a pattern with a vertical or horizontal line of a single colour (as in FIG. 24). Thirdly, the pattern of FIG. 20 is more symmetric. This means that crosstalk between pixels has a more equal effect on each colour channel, and is easier to compensate by software correction.

Addition to complementary colours has additional advantages for low light conditions. The collected signal is stronger than the signal in a primary colour filter system, as light in two spectral bands is combined together. Since binning is often applied in low light conditions, this is an advantage. The black dots in FIG. 22 indicate the location on which the colour filter data must be interpolated in binned mode to reconstruct an image at ¼ of the full resolution. FIGS. 21 and 24 show arrays of 16×4 pixels. After charge binning, an image of 8×2 pixels must be reconstructed. This can be performed in the following way:

- on the cross-sections of Ye, Cy and 2G pixels, the Ye and Cy colours are taken from the corresponding Ye and Cy neighbour pixels. The Mg colour is calculated as Cy+Ye−2G (since Cy+Ye−2G=G+B+G+R−2G=B+R Mg).
- on the cross-sections of Ye, Cy and Mg pixels, all 3 complementary colours can be taken from these three neighbours.

If required, the complementary colours can be recalculated to a primary colour scheme by the equation set written above.

Equivalent schemes can be thought of starting from a complementary colour filter array system in full resolution, which is added in binning mode. The additions operated through charge binning result in the following equation set:

$$Ye+Cy=R+2G+B=L+G$$

$$Mg+Cy=R+2B+G=L+B$$

$$Mg+Ye=2R+B+G=L+R$$

with L=R+G+B referring to the luminance (intensity) signal. These equations show that each of the binned pixels will have a luminance signal (L=R+G+B) and one primary colour component.

The invention is not limited to the embodiments described herein, which may be modified or varied without departing from the scope of the invention.

The invention claimed is:

1. A pixel array comprising:
 a plurality of photo-sensitive elements arranged in rows and columns, wherein adjacent photo-sensitive elements are aligned with each other in rows and columns; and
 readout circuitry for reading a value of a photo-sensitive element, wherein an instance of the readout circuitry is provided for each pair of adjacent photo-sensitive elements, the instance of the readout circuitry being shared by the pair of photo-sensitive elements,
 wherein adjacent instances of the readout circuitry are staggered with respect to one another, and
 wherein an instance of the readout circuitry comprises at least one of the following:
 a buffer amplifier for buffering a signal from the photo-sensitive element;
 a reset switch for resetting a sense node to a predetermined voltage;
 a select switch for selectively reading a buffered signal from the pixel.

2. A pixel array according to claim 1 wherein a first instance of the readout circuitry serving a pair of photo-sensitive elements is offset from a second, adjacent, instance of the readout circuitry serving a different pair of photo-sensitive elements by a horizontal distance of one column and a vertical distance of one row of the array.

3. A pixel array according to claim 1 wherein each instance of the readout circuitry comprises a plurality of switches formed as a set of features in semiconductor layers and wherein each photo-sensitive element is surrounded by substantially the same set of features located in the same relative positions.

4. A pixel array according to claim 1 wherein each instance of the readout circuitry comprises a plurality of switches formed as a set of features in semiconductor layers, each instance of the readout circuitry having a length of substantially two photo-sensitive element pitches, and wherein the appearance of a part of the set of features in a first of the photo-sensitive element pitches is substantially the same as the appearance of a part of the set of features in the second of the photo-sensitive element pitches so that each photo-sensitive element is surrounded by substantially the same set of features located in the same relative positions when adjacent instances of the readout circuitry are staggered with respect to one another.

5. A pixel array according to claim 4 wherein the set of features comprises at least one of: a dummy semiconductor feature; a dummy track.

6. A pixel array according to claim 1 wherein each instance of the readout circuitry serves a pair of adjacent photo-sensitive elements in a column of the array and the readout circuitry is positioned between the adjacent photo-sensitive elements.

7. A pixel array according to claim 1 wherein each instance of the readout circuitry serves a pair of adjacent photo-sensitive elements in a row of the array.

8. A pixel array according to claim 1 wherein each instance of the readout circuitry serves a pair of adjacent photo-sensitive elements which are diagonally adjacent in the array and the readout circuitry is positioned between the adjacent photo-sensitive elements.

9. A pixel array according to claim 1 wherein each photo-sensitive element comprises a transfer gate connected between the photo-sensitive element and a sense node of the readout circuitry, for controlling transfer of charges to the sense node, and wherein the array further comprises a transfer control line for each row of the array for controlling operation of respective transfer gates, wherein transfer control lines for adjacent rows of the array are spaced apart by a distance of one row.

10. A pixel array according to claim 1 wherein an instance of the readout circuitry comprises two buffer amplifiers arranged in parallel.

11. A pixel array according to claim 1 wherein an instance of the readout circuitry comprises two select switches arranged in parallel with one another and connected to a common select control line.

12. A pixel array according to claim 1 wherein an instance of the readout circuitry comprises a first select switch and a second select switch arranged in series with one another, the first select switch being connected to a first select control line and the second select switch being connected to a second select control line.

13. A pixel array according to claim 1 further comprising at least one of:
   a select control line connecting to instances of the readout circuitry in a row of the array, the select control being for selecting an output value of the readout circuitry;
   a reset control line connecting to instances of the readout circuitry in a row of the array, the reset control being for resetting the readout circuitry.

14. A pixel array according to claim 1 further comprising a correction module which is arranged to calculate a pixel value for a defect pixel in the array based on neighbouring, non-defect, pixel values.

15. A pixel array according to claim 1 wherein the pixel array is overlaid with a colour filter array pattern which is configured such that the same colour overlays a pair of photo-sensitive elements sharing an instance of the readout circuitry.

16. A pixel array according to claim 1 wherein each instance of the readout circuitry is shared by a pair of photo-sensitive elements and wherein the pixel array is overlaid with a colour filter array pattern which is configured such that a first pair of photo-sensitive elements which share an instance of the readout circuitry are overlaid by the colours red and blue.

17. A pixel array according to claim 16 wherein each instance of the readout circuitry is shared by a pair of photo-sensitive elements and wherein the pixel array is overlaid with a colour filter array pattern which is configured such that:
   a second pair of photo-sensitive elements which share an instance of the readout circuitry are overlaid by the colours red and green;
   a third pair of photo-sensitive elements which share an instance of the readout circuitry are overlaid by the colours green and blue;
   a fourth pair of photo-sensitive elements which share an instance of the readout circuitry are overlaid by the colour green;
and wherein the first, second, third and fourth pairs of photo-sensitive elements are adjacent to each other in the pixel array.

18. A pixel array according to claim 16 wherein each instance of the readout circuitry serves a pair of adjacent photo-sensitive elements which are aligned with a row of the array.

19. A pixel array according to claim 16 wherein each instance of the readout circuitry serves a pair of adjacent photo-sensitive elements which are aligned with a column of the array.

* * * * *